United States Patent [19]

Chang et al.

[11] Patent Number: 4,963,950
[45] Date of Patent: Oct. 16, 1990

[54] METAL OXIDE SEMICONDUCTOR GATED TURN-OFF THYRISTOR HAVING AN INTERLEAVED STRUCTURE

[75] Inventors: Hsueh-Rong Chang, Scotia; Bantval J. Baliga, Schenectady, both of N.Y.

[73] Assignee: General Electric Company, Schenectady, N.Y.

[21] Appl. No.: 188,887

[22] Filed: May 2, 1988

[51] Int. Cl.$^5$ .................. H01L 29/10; H01L 29/78; H01L 29/74; H01L 29/86

[52] U.S. Cl. .................. 357/23.4; 357/23.12; 357/38; 357/55

[58] Field of Search ............... 357/23.4, 23.12, 38, 357/55

[56] References Cited

U.S. PATENT DOCUMENTS

| | | | |
|---|---|---|---|
| 4,760,432 | 7/1988 | Stoisiek et al. | 357/38 |
| 4,782,379 | 11/1988 | Baliga | 357/38 |
| 4,799,095 | 1/1989 | Baliga | 357/55 |
| 4,827,321 | 5/1989 | Baliga | 357/55 |

FOREIGN PATENT DOCUMENTS 2824133 12/1978 Fed. Rep. of Germany .... 357/38 T
3447220 7/1985 Fed. Rep. of Germany .... 357/38 T Primary Examiner—Rolf Hille
Assistant Examiner—David M. Ostrowski
Attorney, Agent, or Firm—Robert Ochis; Marvin Snyder; James C. Davis, Jr.

[57] ABSTRACT

A depletion mode thyristor includes a plurality of regenerative segments and a plurality of non-regenerative segments, each of which is elongated in a first direction. Regenerative and non-regenerative segments are interleaved in a second direction perpendicular to said first direction. A plurality of regenerative segments may be disposed between adjacent non-regenerative segments. Adjacent regenerative or non-regenerative segments are spaced apart by gate electrode segments which are effective, upon application of an appropriate bias voltage, for pinching off the regenerative segments to force the current therein to transfer to the non-regenerative segments to turn the device off. This structure enables large quantities of current to be transferred from regenerative segments to non-regenerative segments during turn-off without inducing detrimental current crowding.

22 Claims, 9 Drawing Sheets

METAL OXIDE SEMICONDUCTOR GATED TURN-OFF THYRISTOR HAVING AN INTERLEAVED STRUCTURE

RELATED APPLICATIONS

This application is related to U.S. patent applications entitled "Metal Oxide Semiconductor Gated Turn-Off Thyristor", Ser. No. 069,806 filed July 6, 1987; "Metal Oxide Semiconductor Gated Turn-Off Thyristor Including a Schottky Contact", Ser. No. 114,357, filed Oct. 29, 1987; and "Metal Oxide Semiconductor Gated Turn-Off Thyristor Including a Low Lifetime Region", Ser. No. 188,888 filed May 2, 1988, all by Bantval J. Baliga, one of the present inventors and all assigned to the instant assignee. The present invention is an improvement on the inventions described and claimed in these related applications. Each of these related applications is incorporated herein, by reference, in its entirety.

FIELD OF THE INVENTION

The present invention relates to the field of four-layer, latching, semiconductor devices and, more particularly, to such devices whose conduction and/or turn-off may be controlled by the voltage on the gate electrode of a metal oxide semiconductor (MOS) portion of the device.

In designing MOS gated four-layer (NPNP) semiconductor devices which are intended to latch into an on condition when conducting sufficient current and which are intended to be capable of being turned off by a voltage applied to the MOS gate structure, care must be taken to ensure that turn-off transients do not have a detrimental effect on the device structure and to ensure that the device will have as large a safe operating area (SOA) as possible. One factor which can contribute both to device destruction and to a relatively small SOA is current crowding during turn-off. An MOS gated latching four layer device is most useful if it has as low an ON-resistance as possible and as large an SOA as possible.

Accordingly, it is an object of the present invention to provide an improved MOS gated turn-off latching NPNP semiconductor device having a low ON-resistance and a large SOA.

Another object of the invention is to provide a MOS gated thyristor in which current crowding is avoided during turn-off.

SUMMARY OF THE INVENTION

In accordance with the present invention, the foregoing objects are achieved by a semiconductor device having a regenerative or thyristor structure including first, second, third and fourth regions of alternating conductivity types arranged in series in that order between first and second power electrodes in which a three layer, non-regenerative structure is disposed adjacent to and interleaved with the regenerative structure. This device includes an MOS gate electrode which is interleaved with and spaces apart adjacent segments of the regenerative and non-regenerative portions. In the regenerative portion of the device, the MOS gate electrode is disposed adjacent to the second or third region with the gate electrode and the regenerative portion configured in a manner which enables the application of an appropriate gate bias voltage to the gate electrode to pinch off that second or third region to force current flow to transfer from the regenerative portion of the structure to the non-regenerative portion of the structure. The gate electrode, the regenerative portions and the non-regenerative portions are preferably each comprised of a plurality of elongated relatively narrow segments which are interleaved in a direction perpendicular to their direction of elongation. Alternatively, the segments may be in the form of concentric, interleaved annuluses or arcs. With this structure, during turn-off of the device, the gate electrode pinches off the regenerative portion of the structure and the current flowing therethrough transfers from the regenerative-structure side of a gate electrode segment to a non-regenerative-structure side of the gate electrode segment whereby the current transfer distance is extremely small and current crowding is avoided.

The regenerative and non-regenerative segments may be interleaved in a number of different ways. Regenerative and non-regenerative segments may alternate or a number of regenerative segments may be located between adjacent non-regenerative segments. In either event, adjacent segments, whether regenerative or non-regenerative, are spaced apart by gate electrode segments.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
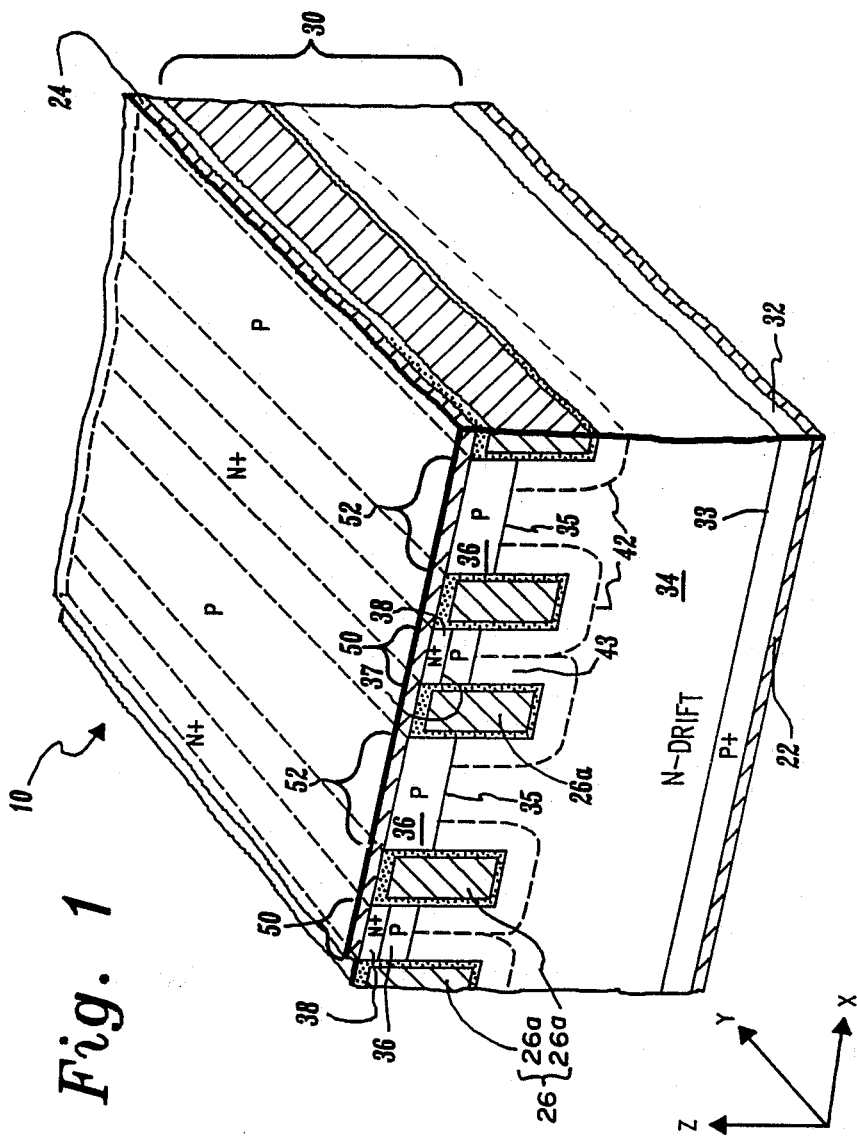
FIG. 1 is a sectional, partially cutaway perspective view of a semiconductor device structure in accordance with the present invention.

In FIG. 1, a depletion mode thyristor (DMT) 10 in accordance with the present invention is shown in perspective view. This device comprises a body 30 of semiconductor material which includes a four layer or regenerative portion including a first or lower layer 32 of P+ conductivity material, a second layer 34 of N type conductivity material disposed adjacent to and forming a PN junction 33 with the upper surface of the layer 32, a third layer 36 of P type material disposed adjacent to the upper surface of the N type layer 34 and forming a second PN junction 35 therewith and a fourth layer 38 of N+ conductivity material disposed adjacent to the upper surface of the third layer and forming a third PN junction 37 therewith. In a thyristor, the layers 32, 34, 36 and 38 are often referred to as the anode emitter, the N-type base, the P-type base and the cathode emitter, respectively. Adjacent to this four layer, regenerative structure 50 within the same semiconductor body is disposed a three layer, non-regenerative structure 52 comprised of the layers 32, 34 and 36. A set of reference rectangular coordinates are included in FIG. 1 at the lower left. These coordinates are used in the following description to specify directions in the figure.

An anode electrode 22 is disposed in ohmic contact with the lower surface of the P+ region 32 and a cathode electrode 24 is disposed in ohmic contact with the upper surface of the N+ region 38 in the regenerative segments and in ohmic contact with the P region 36 of the non-regenerative segments. The P region 36 does not extend to the cathode metallization 24 in the regenerative segments 50, but does extend to the cathode metallization in the non-regenerative segments 52. However, the P region 36 is given the same reference numeral in both the regenerative and the non-regenerative segments because the entire P region 36 is formed as a single layer (preferably by diffusion) during device fabrication. The lesser vertical extent of the P region 36 within the regenerative segments 50 in the final device is a result of the formation of the N+ region 38 by diffusion into the upper surface of the semiconductor body 30. This diffusion counter dopes (over compensates) the upper part of the original region 36 in the regenerative segments 50 of the device to connect it to N+ conductivity.

Both the regenerative portion of the structure and the non-regenerative portion of the structure are in the form of a plurality of substantially parallel elongated segments 50 and 52, respectively. As seen in FIG. 1, these segments are elongated in the Y-direction and are interleaved and alternate with each other in the X-direction. Adjacent regenerative and non-regenerative segments are spaced apart by segments 26a of an insulated gate electrode 26. The segments 26a of the gate electrode extend into the semiconductor body 30 from the upper surface thereof through the layers 38 and 36 and into the layer 34. The individual segments 26a of the gate electrode may be quite narrow (for example 1 to 3 microns in width), and are positioned adjacent to opposite sides of regenerative segments 50. A segment 43 of the layer 34 extends upward in each regenerative segment 50 between the gate electrode segments 26a which bound that regenerative segment. The segments 43 of the layer 34 are made narrow enough that application of an appropriate negative voltage to the gate electrode relative to the layer 34 will deplete the segments 43 thereby pinching off current flow through segments 43. The regenerative segments 50 are preferably between 2 and 5 microns in width (X-direction) in order that they may be able to conduct substantial current at a zero volt gate voltage and still be pinched off with a gate voltage of about 10-15 volts. These segments may have any desired Y-direction length. However, in practical devices, the Y-direction length of these segments may be limited by the need to connect the gate electrode segments 26a to an external contact in a manner in which the resistance of the gate segments 26a does not limit device operating characteristics. The device 10 is a three terminal device having power electrodes 22 and 24 and an MOS gate electrode structure 26 for controlling the conductivity of the device.

In the FIG. 1 embodiment, the non-regenerative segments 52 are made wider (X-direction) than the regenerative segments 50 in order that the non-regenerative segments 52 will not be pinched off by the application of the pinch-off voltage to the gate electrode segments. The non-regenerative segments 52 are preferably between 5 and 30 microns wide to ensure that they will not be pinched off and will have a sufficient conductive width to conduct transient turn-off currents when the regenerative segments are first pinched off. By leaving the non-regenerative segments 52 conductive (not pinched off) during device turn-off, charge stored in the N type base region 34 is provided with a conductive path across P region 36 to the cathode electrode 24 via which the hole portion of that stored charge is withdrawn from the structure while the electron portion of that stored charge is attracted to anode electrode 22. This substantially reduces turn-off time since these stored carriers are withdrawn from the structure through the anode-cathode circuit rather than dissipating within the structure through the more time consuming process of recombination.

When the cathode electrode 24 is held at ground voltage and the anode electrode 22 is held at a positive voltage relative to the cathode electrode, this device may be turned on by applying a positive voltage to the gate electrode 26 which is of sufficient magnitude to create an inversion layer in the region 36 adjacent the gate electrode segments in the regenerative portion of the device. Under these conditions, electrons will flow from the N+ emitter region 38 through this inversion layer or channel within the P type region 36 and into the N type region 34 where they serve as base current for the PNP transistor portion of the four layer structure. The resulting current flow is sufficient to initiate regenerative thyristor action in the four layer regenerative portion of the structure. Once such action commences, the gate voltage may be removed from the gate electrode 26 without affecting the regenerative action. In general, by the phrase "may be removed", it is intended to indicate that the voltage of the gate electrode relative to the P region 36 may be reduced either by allowing the gate electrode 26 to float or by applying a voltage to it which is close to the cathode or anode voltage since, while the device is in an ON-state, the cathode and anode electrodes are at substantially the same voltage (within the voltage drop produced across the device by the ON-state current).

While this device is operating in a regenerative mode, a substantial percentage of the current flows vertically through the regenerative portion of the device between the P+ region 32 and the N+ region 38 because this is the location where the regenerative action takes place. However, some carriers will diffuse into the non-regenerative portion of the structure with the result that the PNP transistor comprising the layers 32, 34 and 36 also contributes to the ON-state current flow. Because in the embodiment of FIG. 1, the non-regenerative segments 52 are wider than the regenerative segments, there is significant opportunity for current flow through the non-regenerative portion of the structure. Such current flow has an adverse, but tolerable effect, on the ON-state resistance (ON-resistance) of the device and its current carrying capacity because it results in not all of the current which flows through the device contributing to the regenerative action. That causes the ON-state resistance to increase and the ON-state current density to decrease as compared to a device which is entirely regenerative.

When it is desired to turn the device 10 off, a large negative voltage is applied to the gate electrode 26 relative to the layer 34. As a consequence, depletion regions shown by the dash lines 42 in FIG. 1 form around each gate electrode segment 26a. As shown in FIG. 1, the depletion regions from adjacent gate electrode segments merge and pinch off the segment 43 of the region 34 which extends upward between adjacent gate electrode segments in the regenerative segments 50 of the device. This immediately stops current flow through the segment 43 of the layer 34 which comprises the regenerative segment. However, because of the greater width of the non-regenerative segments 52, these gate-induced depletion regions 42 do not extend all the way across the width of the non-regenerative segments 52 and therefore do not merge and do not pinch off the non-regenerative segments 52. Consequently, the charge stored in the layer 34 is attracted into the non-regenerative segments by the relative potentials within the device. The electrons are attracted to the anode electrode 22 since the applied voltages are of a direction to encourage electron flow across the junction 33. However, the potential barrier of junction 33 is sufficient to prevent enough electrons from crossing junction 33 to dissipate the stored charge. The holes are attracted to the cathode metallization 24 because the polarity of the potentials attracts holes across the PN junction 35 to the cathode metallization 24. As a result, the stored charge dissipates rapidly via current flow in the anode-cathode circuit without violation of the rule of quasi-neutrality which says that neither type of charge carrier can increase its population relative to the other type to the point where there is a large build up of charge. As a consequence, the carriers stored in the base layer 34 are rapidly dissipated with the result that the structure has a relatively large safe operating area (SOA). If desired, a low lifetime region in accordance with the above-identified incorporated by reference application entitled "Metal Oxide Semiconductor Gated Turn-Off Thyristor Including a Low Lifetime Region" may be included in the non-regenerative portion of the structure to further speed the charge dissipation process. As a result of the presence of this non-regenerative, non-pinched-off current path, the current flowing in a regenerative segment 50 at the time of pinch-off is diverted to flow through this X-direction adjacent non-regenerative segments.

Details of device operation and fabrication may be found in the first two of the above-identified, incorporated by reference, related applications.

The device structure of FIG. 1 is considered highly desirable from the point of view of current crowding in that current flowing through a given regenerative segment 50 is transferred only the short X-direction distance from that segment to the adjacent non-regenerative segment 52 which is spaced therefrom by the relatively narrow width of the gate electrode segment 26a. This width-wise transfer takes place over substantially the entire Y-direction length of the regenerative segment with the result that, even if the non-regenerative segment is carrying equal current with the regenerative segment, the current through that non-regenerative segment only doubles during turn-off and then for only the short duration it takes to dissipate the stored charge. This is in contrast to the situation in a long gate electrode segment version of a structure such as that illustrated in FIGS. 8 and 10 of the above-identified application entitled "Metal Oxide Semiconductor Gated Turn-Off Thyristor" in which the current is transferred lengthwise of the gate electrode segments during turn-off. In a structure of that type, the longer the gate electrode segments are made, the further the current must transfer and the further stored charge has to diffuse or drift in order to reach the cathode electrode and the more current crowding can occur. In the present structure, if the ends of the regenerative segments are bounded by the non-regenerative portion of the structure, then there may be some lengthwise transfer of the regenerative current, but that will only be in the vicinity of the ends of the regenerative segments where the lengthwise transfer distance is similar to the width-wise transfer distance.

What is important in a structure of this type from the point of view of providing rapid turn-off and a large SOA is that the non-regenerative segments 52 of the structure not be pinched off during turn-off, while the regenerative segments 50 must be pinched off during turn-off. A number of different techniques and structures may be used to prevent the pinch off of the non-regenerative segments 52. The technique illustrated in FIG. 1 is one of making the non-regenerative segments 52 wider than the regenerative segments 50, thereby preventing the same gate voltage which pinches off the regenerative segments 50 from pinching off the non-regenerative segments 52. An alternative structure for achieving this result is illustrated in FIG. 2.

Figure 2:
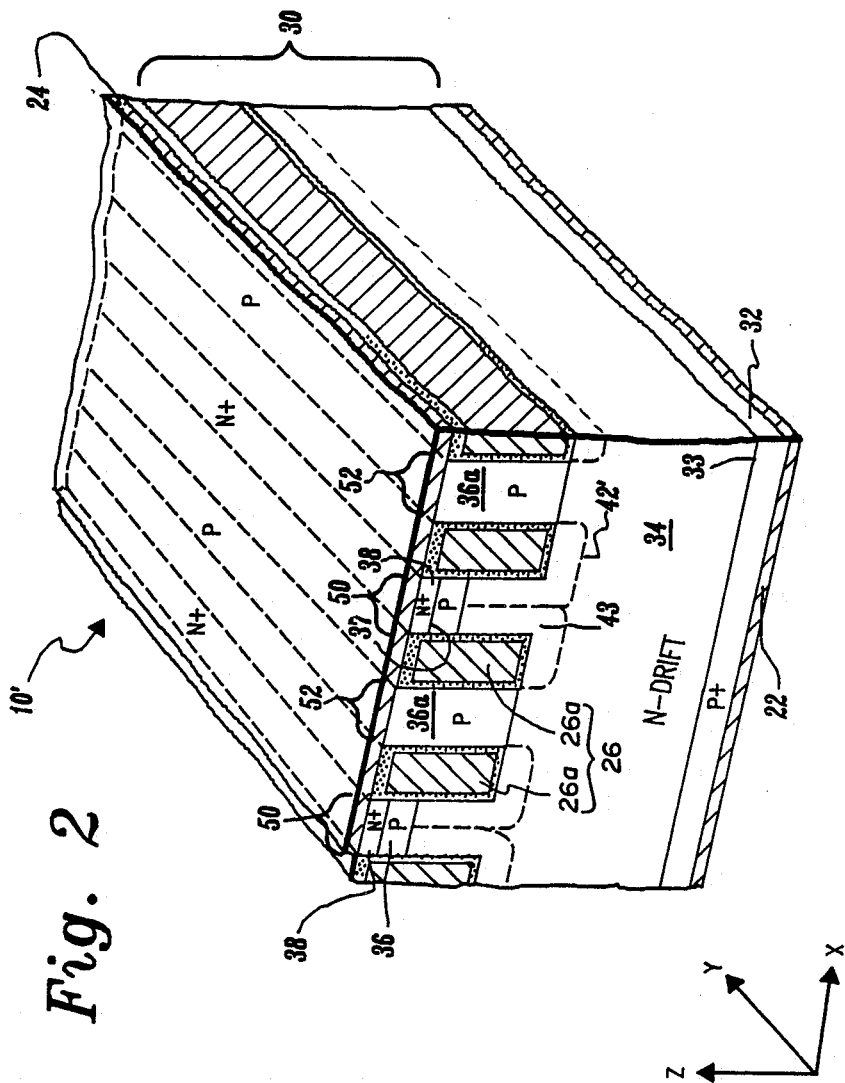
FIGS. 2–9 illustrate a variety of modified versions of the FIG. 1 device.

FIG. 2 illustrates a device 10' similar to that FIG. 1 and has the same portions of the structure identified with the same reference numerals. The significant difference between the device 10 of FIG. 1 and the device 10' of FIG. 2 is in the non-regenerative segments 52 and in particular, is in the portion of the P type layer 36 in the non-regenerative segments 52. In FIG. 2, the portion of the layer 36 in the non-regenerative segments 52 is identified by the reference numeral 36a. The region 36a differs from the region 36 in the regenerative segments 50 in that it extends further into the semiconductor body 30 and preferably to substantially the same depth as the gate electrode segments 26a. As illustrated by the dash lines 42' in FIG. 2, the presence of the P type material of region 36a in the non-regenerative portion extending to the bottom of the gate segments 26a prevents the gate-induced depletion regions from extending across and pinching off the non-regenerative segments 52 even though the non-regenerative segments 52 are of the same width as, or are narrower than, the regenerative segments 50. This is because the application of the negative voltage to the gate electrode 26a tends to attract holes within the P type region 36a rather than to deplete it and this results in termination of the field lines in the non-regenerative segments on charges which are close to the gate segment, preventing the depletion regions 42' from extending across that P region 36a and the N type region 34 at their juncture.

This alternative structure has several advantages over the structure of FIG. 1. First, since the non-regenerative segments 52 may be made the same width as, or narrower than, the regenerative segments 50, the percentage of the structure which is regenerative is increased. For example, if in the FIG. 1 structure the non-regenerative segments 52 are twice as wide as the regenerative segments 50, then only one third of the active area of the device is regenerative. In contrast, in the FIG. 2 structure, if the regenerative and non-regenerative segments are made of equal width, then half the active area of the device is regenerative. This results in lower ON-resistance for the device along with a higher average current density and enables the device to conduct substantially more current per unit area. If the non-regenerative segments 52 are made narrower than the regenerative segments 50, the percentage of the structure which is regenerative is further increased. A P+ portion (not shown) of the region 36a may be provided adjacent to the cathode metallization in order to ensure the creation of an ohmic contact between the cathode metallization and the P region 36a.

In the structure of FIG. 2, if it is desired to do so, the ON-state current of the device can be substantially restricted to the regenerative portions of the structure in the following manner. First, the doping density within the P type region 36a in the non-regenerative segments 52 is selected and adjusted in accordance with the width of those non-regenerative segments to provide a structure in which application of a selected ON-state gate voltage which is positive, but too small to create an inversion layer in the P type region 36 of the regenerative segments of the device, is sufficient to create a significant depletion layer within the P type region 36a to thereby narrow the conductive width of, or pinch off, the region 36a, thereby limiting or preventing current flow through that region. Naturally, the selected width for the non-regenerative segments and the selected doping density must be within a range which still prevents the application of the negative turn-off voltage to the gate electrode segments 26a from resulting in pinch off of the N type layer 34 immediately below the P type region 36a.

With a device of this structure and doping level, a large positive voltage may be applied to the gate electrode segments to turn the device on as has been described above in connection with FIG. 1. This voltage may then be reduced to a level at which the regions 36a are pinched off, but the regions 36 do not have an accumulation layer thereacross. Such an accumulation layer would short out the junction 35 in the regenerative portion of the structure and prevent regeneration. Alternatively, the device may be turned on by inverting the channel regions of the portions 36a without inverting regions 36 so that electrons can flow directly from the cathode electrode into the inverted channel and on to the N region 34 to provide base current for the PNP transistor portion of the thyristor regenerative structure. A further consideration in selecting the doping density in the region 36a is ensuring that this region has sufficient conductivity during device turn-off to carry the turn-off transient currents without endangering the device structure through increased resistance. However, depending on the gate turn-off voltage, this consideration may be obviated for low P type doping densities by the creation of an accumulation layer adjacent the gate electrode which will conduct substantial quantities of holes. When it is desired to turn the device off, the gate voltage is made negative in the same manner as has been described above with respect to the FIGS. 1 and 2 structures.

Figure 3:
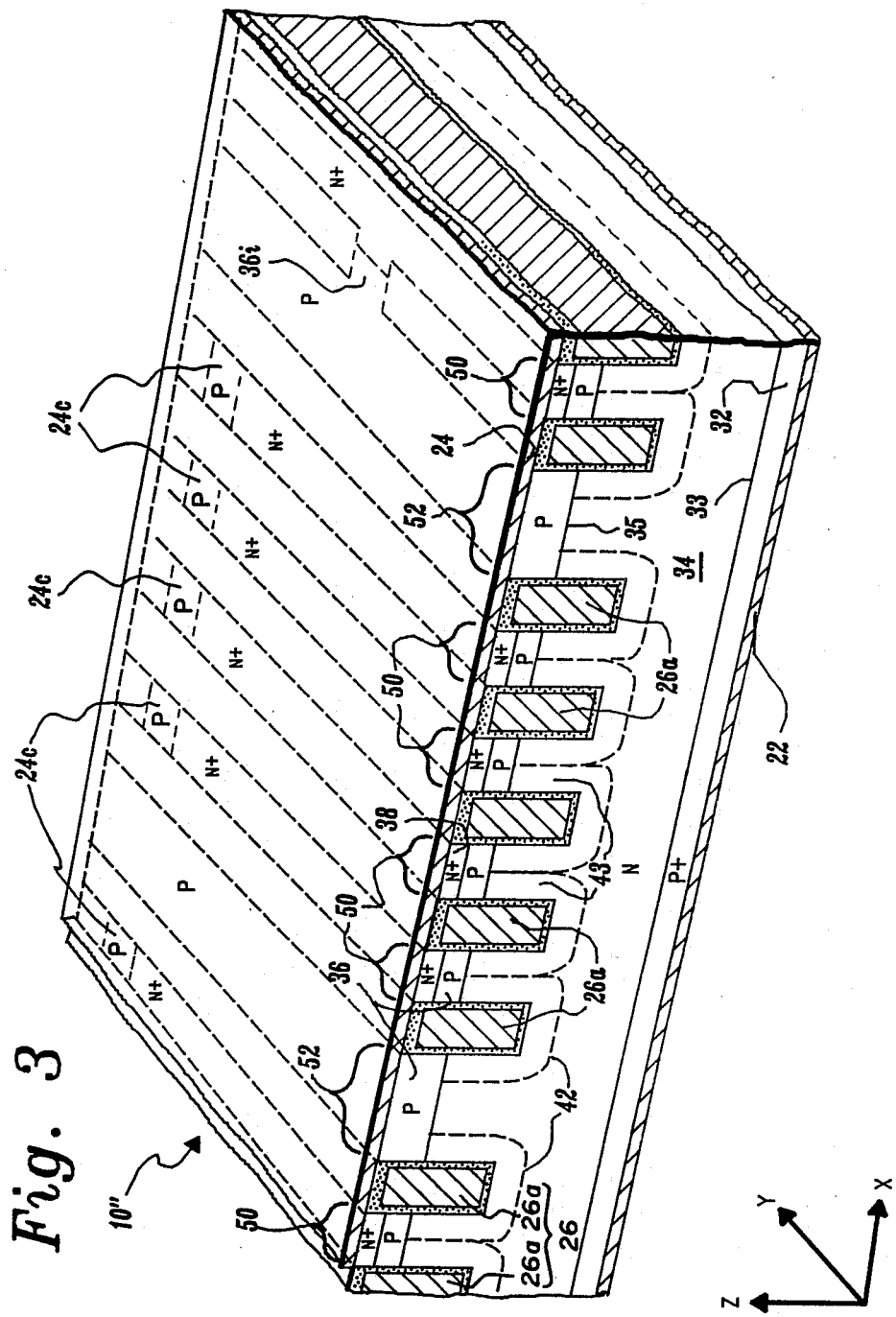

In FIG. 3, a device 10" is shown in which the number of regenerative segments 50 is substantially greater than the number of non-regenerative segments 52. As illustrated, a plurality of regenerative segments 50 (four are shown) are disposed between two adjacent non-regenerative segments 52. Each of the regenerative segments 50 is spaced apart from the adjacent regenerative segments 50 or non-regenerative segments 52 by a gate electrode segment 26a. The inclusion of a plurality of the regenerative segments 50 between adjacent non-regenerative segments 52 gives the effect of having substantially wider regenerative segments than non-regenerative segments while still enabling gate control of the pinch off of each of the regenerative segments. Using this technique, a substantial number of regenerative segments 50 may be placed between adjacent non-regenerative segments 52 before the maximum distance which regenerative current is transferred to reach a non-regenerative segment approaches that for a structure in which the regenerative segments are relatively long and the non-regenerative segments are located at the ends of the regenerative segments rather than to the side of the regenerative segments.

In actual devices, the limit on the number of regenerative segments 50 disposed between adjacent non-regenerative segments 52 will normally result from current crowding considerations in the non-regenerative segment during turn-off and possibly, where extremely fast turn-off is desired, the distance of the current transfer and resulting stored charge diffusion time. Almost any desired ratio of regenerative to non-regenerative area in the active portion of the device may be obtained with this structure. A benefit of this structure is that as the number of regenerative segments 50 between adjacent non-regenerative segments 52 is increased, the percentage of the on-state current which tends to flow through the non-regenerative section decreases because of the increased average distance between a regenerative segment 50 and the nearest non-regenerative segment 52.

In order to use gate 26 as a turn-on gate, the gate 26 must be biased relative to P region 36 of the regenerative segment to induce a channel for electron transport from region 38 to region 34. It is considered preferable to provide ohmic contacts 24c (see FIG. 3) between P region 36 and the cathode metallization 24 at intervals along the Y-direction length of the regenerative segments in order to fix the potential of the P region 36 relative to electrode 24. The ohmic contacts 24c between metallization 24 and the P region 36 of various regenerative segments may be aligned as shown in FIG. 3 or may be systematically or randomly staggered. This ohmic contact is preferably included in, although not shown in, each of the versions of this device in which the gate 26 can be used to control turn-on. As an alternative to having the P type region 36 extend to the surface to contact metallization 24, a narrow isthmus 36i may be left when the trenches are formed. The isthmus 36i then provides a connection between the portions of the P region 36 which are in the regenerative and non-regenerative segments. This isthmus must be narrow enough so that it does not interfere with pinch off of the regenerative region. Another alternative is to provide this connection at the Y-direction ends of the regenerative segments.

Figure 4:
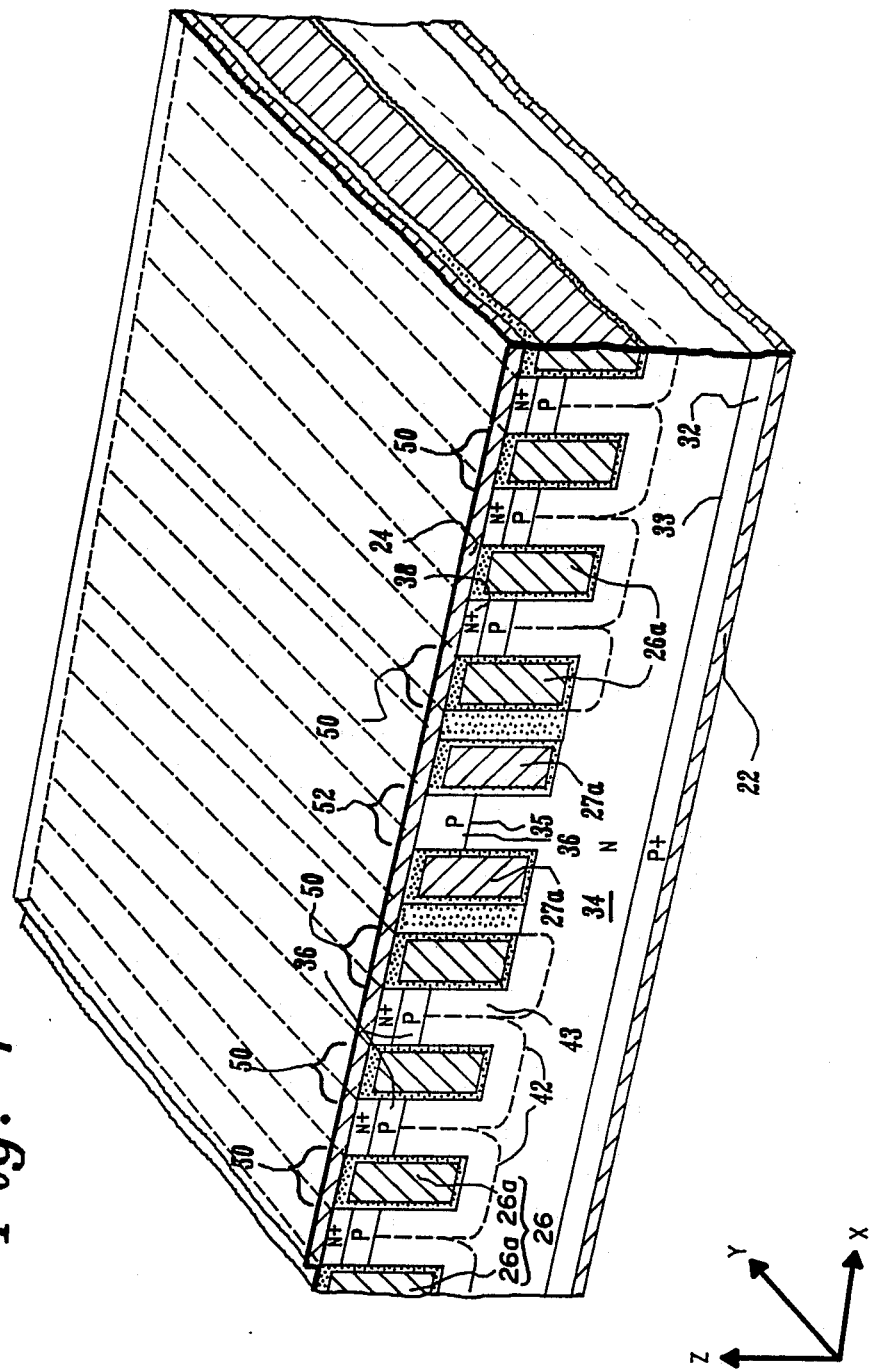

A further alternative technique for preventing pinch off of the non-regenerative portion is illustrated in FIG. 4. The structure shown in FIG. 4 is similar to that shown in FIG. 3 in having a plurality of regenerative segments 50 disposed between adjacent non-regenerative segments 52. It differs from the FIG. 3 structure in having a second gate electrode 27 in the form of individual segments 27a disposed adjacent the non-regenerative segments 52. Sufficient insulation must be provided between the non-regenerative gate electrode segments 27a and the regenerative gate electrode segments 26a in order to prevent dielectric breakdown directly between these gate electrode segments. With this structure, separate bias voltages may be applied to the gate electrodes 26 and 27 which control conduction and pinch off in the regenerative segments and the non-regenerative segments, respectively. The regenerative segments and the non-regenerative segments may have the same width with the result, that when the device is on, a voltage may be applied to the non-regenerative gate 27 to pinch off the non-regenerative segments and force all current to flow in the regenerative segments. During device turn-off, the voltage on the non-regenerative gate 27 is changed to a zero or positive voltage to prevent pinch off, of, or enhance conduction in, the portion of the N type layer 34 which extends between the non-regenerative gate segments 27a. At the same time, a large negative voltage is applied to the regenerative gate segments 26a to pinch off the regenerative segment 50.

This structure requires separate, external contacts to the two separate gate electrodes, making it a four terminal device rather than a three terminal device with a consequent requirement for additional control signals.

A modified version of the FIG. 4 embodiment may replace the non-regenerative gate with dielectric or other spacer material to prevent the voltage on the regenerative gate from causing pinch off of the non-regenerative segments.

Figure 5:
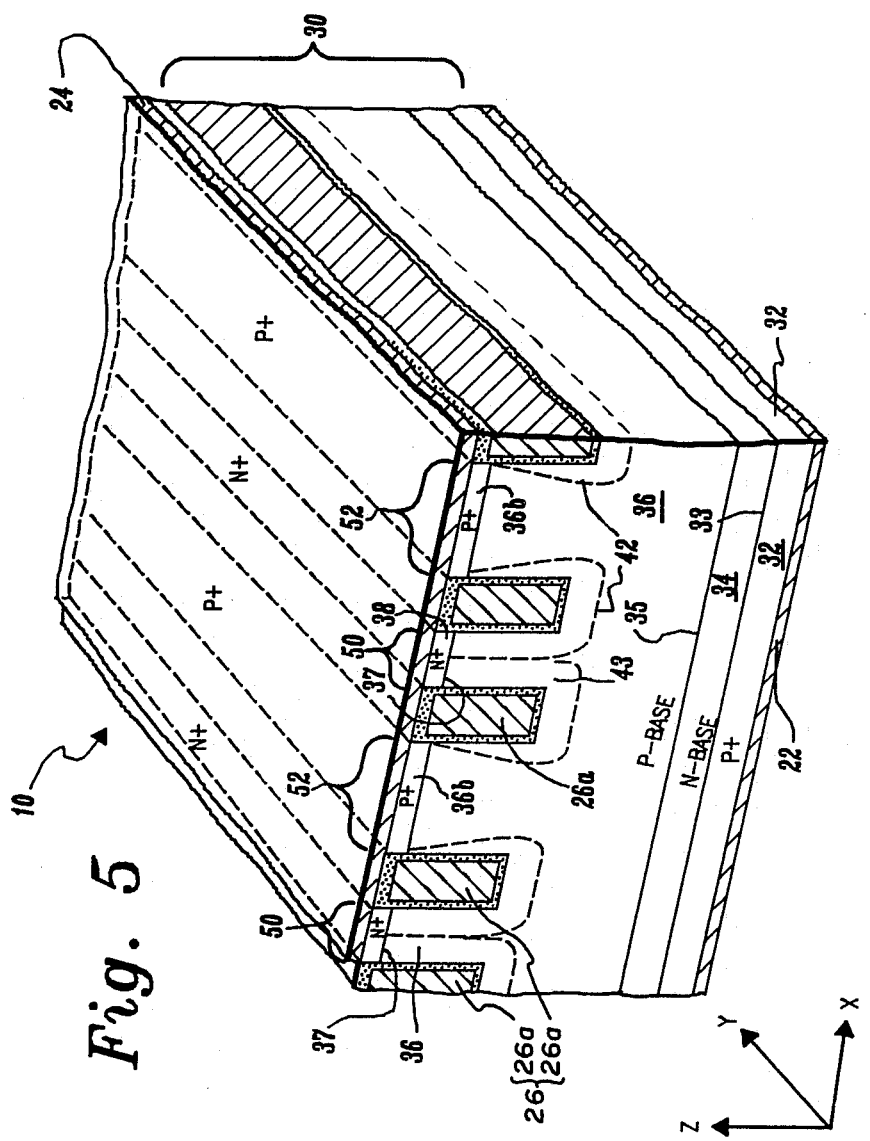
Figure 6:
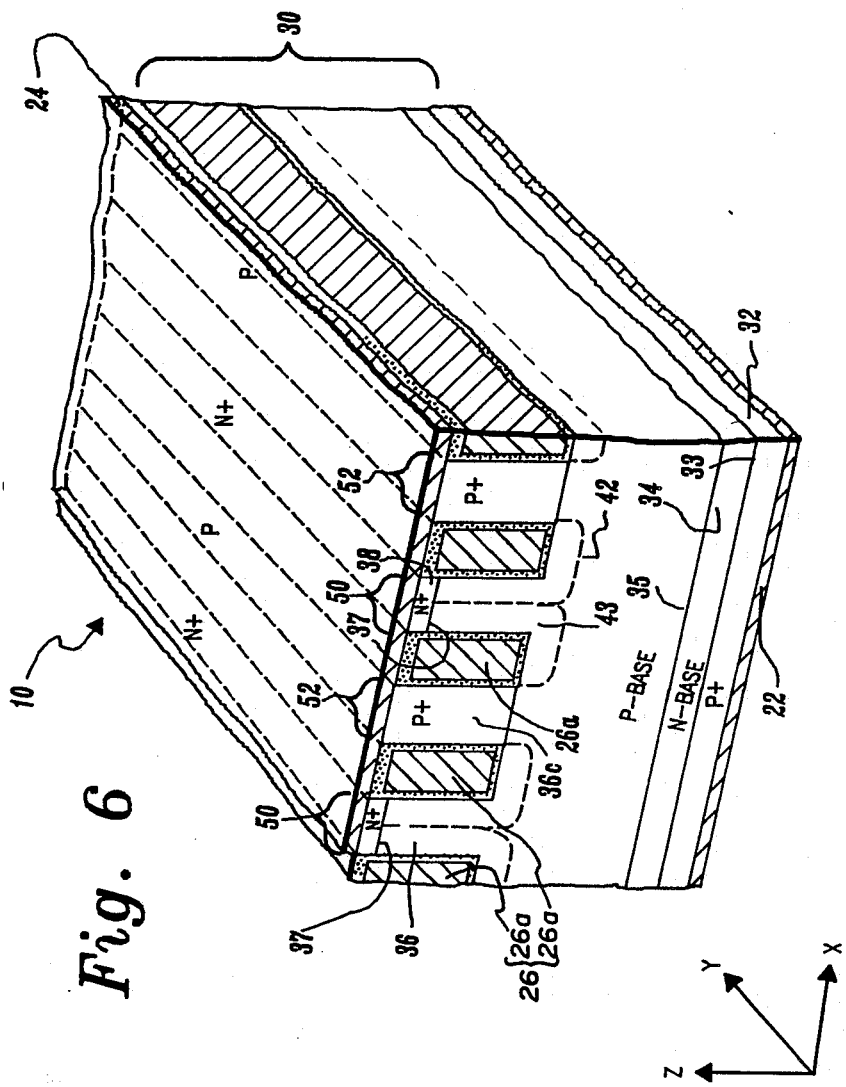

Each of the device structures shown in FIGS. 1–4 employs gate electrode segments disposed in trenches which extend from the cathode side of the structure through the P base into the N base for the purpose of pinching off the N type base region. If it is desired to control conduction via pinch off of the P base rather than the N base, such control may be provided by having the gate electrode extend only into the P base and not into the N base. Such structures are shown in FIGS. 5 and 6, and are similar to the structures shown in FIGS. 1 and 2. In the structures in FIGS. 5 and 6, the P region 36 is shown as being substantially thicker than in FIGS. 1 and 2. However, this thickness is shown for clarity of illustration and is not a necessary feature of the device. In actual devices, the P region 36 can be the same thickness independent of whether the device is intended to be pinched off in the P region 36 or the N region 34. The structure shown in FIG. 5 is similar to that shown in FIG. 1 in that pinch off of the non-regenerative segments 52 is prevented by making those segments wider than the regenerative segments 50. It differs in that a P+ portion 36b of P base 36 is provided adjacent to the cathode electrode 24 to ensure the formation of an ohmic contact. The structure shown in FIG. 6 is similar to that shown in FIG. 2 in that pinch off of the non-regenerative segments 52 is prevented despite the non-regenerative segments 52 being substantially the same width as the regenerative segments 50 by increasing the doping level in the non-regenerative mesa portion of the P type base region to form a P+ portion 36c.

Figure 7:
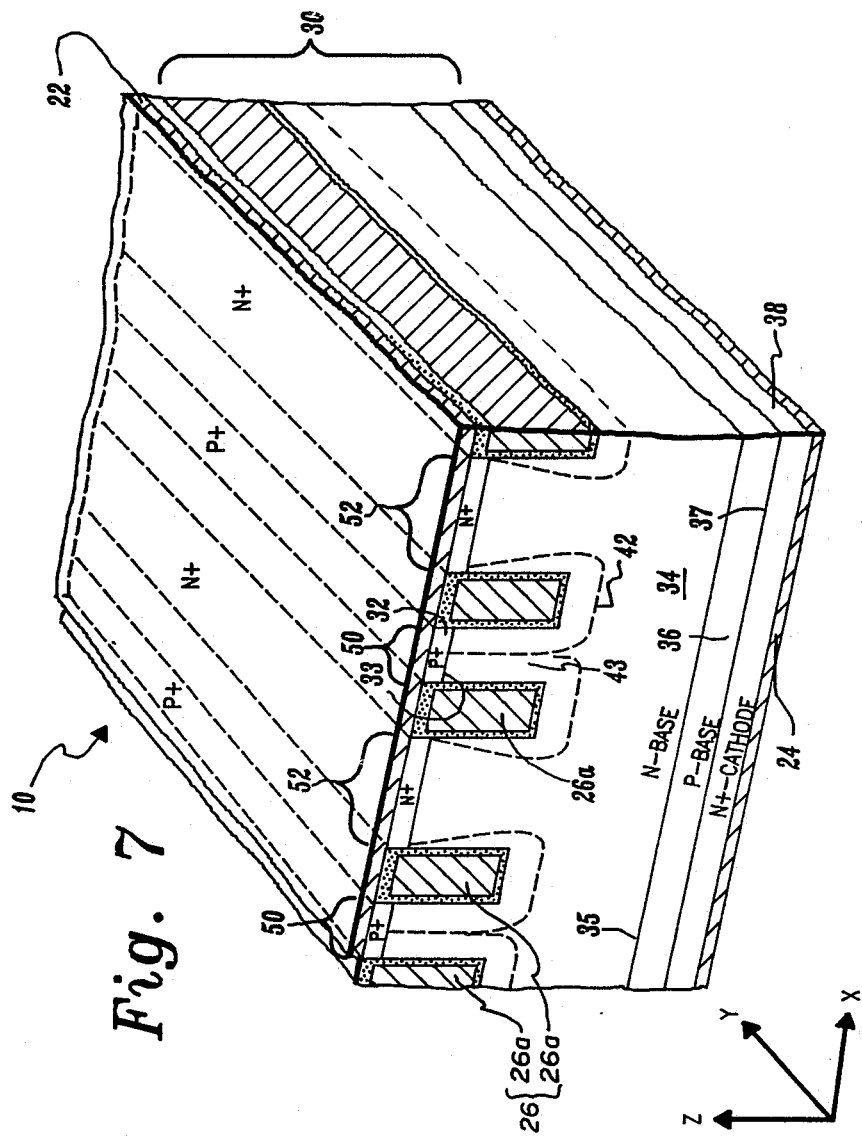
Figure 8:
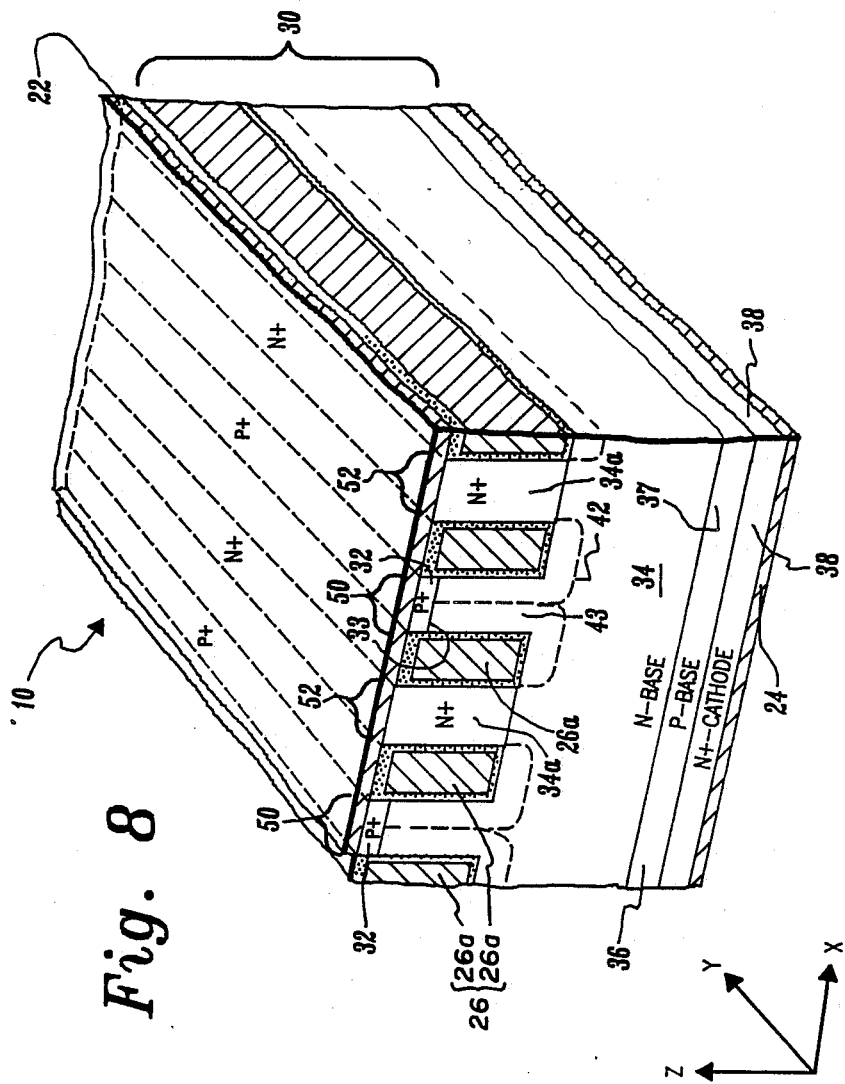

The devices shown in FIGS. 7 and 8 are analogs of those shown in FIGS. 5 and 6 in that the gate electrode extends into the device structure only into the base region nearest to the surface in which the gate trenches are cut, but the trenches are cut through the anode rather than the cathode and it is the N type base which is subject to pinch off. The structure shown in FIG. 7 resembles that shown in FIG. 5 in that pinch off of the non-regenerative segments 52 is prevented by making the non-regenerative segments wider than the regenerative segments 50. The structure shown in FIG. 8 resembles that shown in FIG. 6 in that the non-regenerative segments are substantially the same width as the regenerative segments and pinch off of the non-regenerative segments 52 is prevented by doping the portion 34a of the N type base region which extends between the gate electrodes in the non-regenerative segment to a substantially higher density and hence conductivity level than the remainder of base region 34 to prevent the applied gate voltage from inducing large depletion regions in the portion 34a and thereby prevent pinch off.

Figure 9:
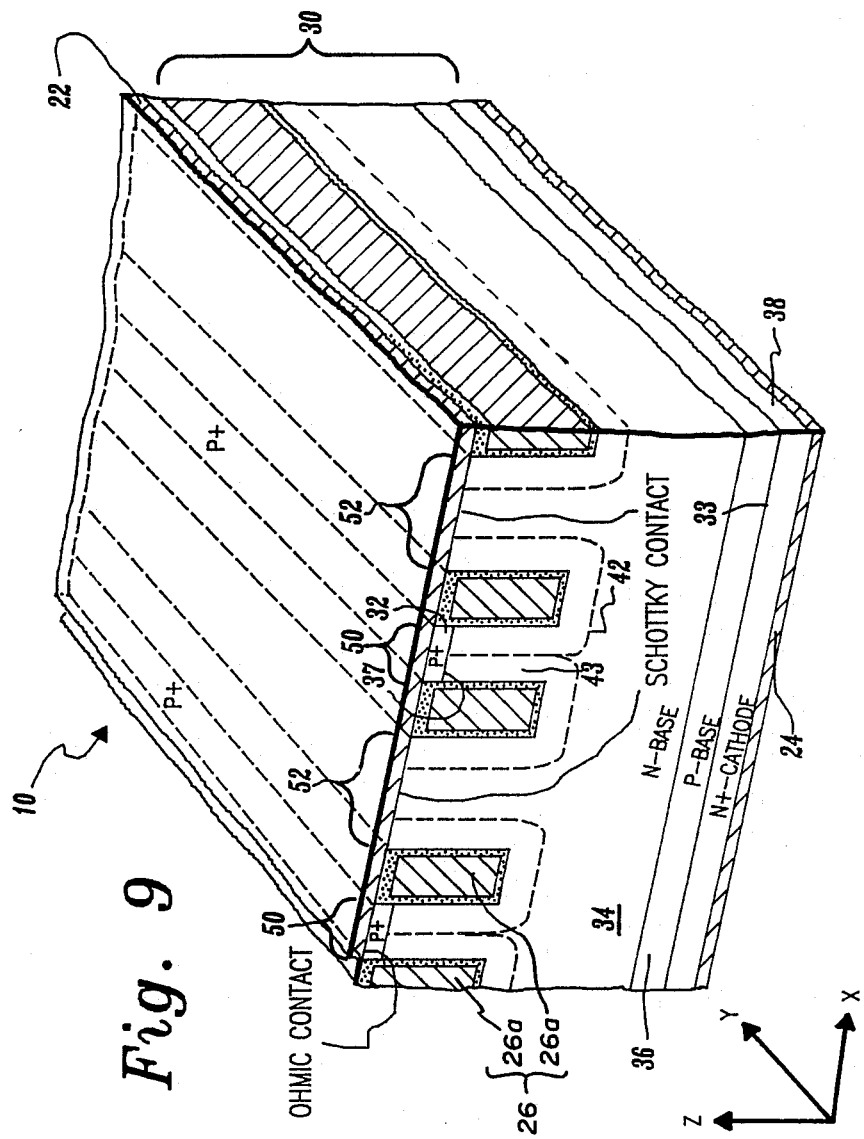

In FIG. 9, a further modification is illustrated in which pinch off of the non-regenerative segments 52 is prevented by making them wider than the regenerative segments 50; however, rather than providing an ohmic contact between the anode metallization and the P region 36 in the non-regenerative segments 52, a Schottky contact is provided. Benefits and further details on the fabrication of such a structure may be found in the above-identified application entitled "Metal Oxide Semiconductor Gated Turn-Off Thyristor Including a Schottky Contact" which is incorporated by reference.

A variety of MOS gated turn-off thyristor structures have been illustrated and described which enable large quantities of current to be transferred from regenerative segments to non-regenerative segments without inducing detrimental current crowding. As an alternative to the rectangular regions and structures of these embodiments, the regenerative segments, the non-regenerative segments and the gate electrode segments can all be made in the shape of annuluses or arcs having a common center or focus. In each of the devices, the conductivity type of each of the regions may be reversed (N type becoming P type and vice versa) to provide a dual of that device.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A semiconductor device comprising:
   first and second power electrodes;
   a body of semiconductor material having a first major surface and including a regenerative portion and a non-regenerative portion each connected between said first and second power electrodes, said regenerative portion including adjoining first, second, third and fourth regions of alternating conductivity type disposed in series in that order between said first and second power electrodes, said first power electrodes being disposed in ohmic contact with said first region and said second power electrode being disposed in ohmic contact with said fourth region;
   an insulated gate electrode disposed adjacent said regenerative portion for pinching off one of said second and third regions in said regenerative portion in response to application of an appropriate gate bias voltage thereto, to thereby divert current from said regenerative portion into said non-regenerative portion of said device to turn said device off; and
   in a plane parallel to said first major surface, said regenerative portion and said non-regenerative portion extending generally parallel to each other and at least part of said regenerative portion being bounded by said gate electrode and said gate electrode spaces at least part of said regenerative portion from an adjacent part of said non-regenerative portion.

2. The semiconductor device recited in claim 1 wherein said non-regenerative portion is spaced from said regenerative portion along substantially the entire length thereof by said insulated gate electrode.

3. The semiconductor device recited in claim 1 wherein said first surface is generally planar and said insulated gate electrode extends from said first surface into said body at least into said one of said second and third regions.

4. The semiconductor device recited in claim 1 wherein:
said regenerative portion comprises a plurality of segments;
said non-regenerative portion comprises a plurality of segments;
said gate electrode comprises a plurality of segments;
said gate electrode segments, said regenerative segments and said non-regenerative segments each being elongated in a first direction and extending substantially parallel, each of said regenerative segments being bounded in a second direction by a gate electrode segment.

5. The semiconductor device recited in claim 4 wherein said non-regenerative segments and said regenerative segments alternate in said second direction.

6. The semiconductor device recited in claim 4 wherein:
said regenerative segments are present in greater number than said non-regenerative segments; and
in said second direction, adjacent non-regenerative segments are spaced apart by a plurality of regenerative segments and a plurality of gate segments.

7. The semiconductor device recited in claim 4 wherein:
said non-regenerative portion includes said second and third regions and only one of said first and fourth regions.

8. The semiconductor device recited in claim 7 wherein:
in said regenerative portion, said one of said second and third regions is said third region;
in said regenerative portion, said first and second regions extend to a lesser depth in said semiconductor body than said gate electrode segments;
said first region being omitted in said non-regenerative segments; and
in said non-regenerative segments said second region extending to substantially the same depth in said semiconductor body as said gate electrode segments to thereby prevent the application of said appropriate gate electrode bias to said gate electrode from pinching off said third region in said non-regenerative portion of said device.

9. The semiconductor device recited in claim 7 wherein:
in said regenerative portion, said one of said second and third regions is said second region;
in said regenerative portion, said first region extends to a lesser depth in said semiconductor body than said gate electrode segments;
said first region being omitted in said non-regenerative segments;
in said non-regenerative segments, at least the portion of said second region which extends from said first electrode into said semiconductor body to substantially the same depth as said gate electrode segments having a substantially higher dopant concentration than in said regenerative portion to thereby prevent the application of said appropriate gate electrode bias to said gate electrode from pinching off said second region in said non-regenerative segments of said device.

10. The semiconductor device recited in claim 7 wherein:

in a plane parallel to said first surface, said regenerative segments, said non-regenerative segments and said gate segments each comprise an arc.

11. The semiconductor device recited in claim 10 wherein:
said arcs are arcs of circles.

12. The semiconductor device recited in claim 11 wherein:
said arcs of circles are concentric.

13. The semiconductor device recited in claim 7 wherein in said non-regenerative portion:
said first region is omitted;
said first power electrode forms a Schottky contact to said second region.

14. A semiconductor device comprising:
first and second power electrodes;
a body of semiconductor material including a regenerative portion and a non-regenerative portion each connected between said first and second power electrodes, said regenerative portion including adjoining first, second, third and fourth regions of alternating conductivity type disposed in series in that order between said first and second power electrodes, said first power electrode being disposed in ohmic contact with said first region and said second power electrode being disposed in ohmic contact with said fourth region;
said non-regenerative portion including said second and third regions and only one of said first and fourth regions;
an insulated gate electrode extending into said body and disposed adjacent to said regenerative portion for pinching off one of said second and third regions in said regenerative portion in response to application of an appropriate gate bias voltage thereto, to thereby divert current from said regenerative portion into said non-regenerative portion of said device to turn said device off;
said regenerative portion, said non-regenerative portion and said gate electrode each comprising a plurality of elongated segments, said non-regenerative portion being spaced from said regenerative portion along the length thereof by said insulated gate electrode; and
means for preventing application of said appropriate gate bias voltage to said gate electrode from pinching off said non-regenerative portion of said device.

15. The semiconductor device recited in claim 14 wherein said means for preventing comprises said non-regenerative segments being substantially wider than said regenerative segments.

16. The semiconductor device recited in claim 14 wherein:
said gate electrode segments extend into said body from a generally planar surface thereof;
said one of said second and third regions is said third region; and
said means for preventing comprises said second region in said non-regenerative portion of said device extending substantially as deep as said gate electrode segments to limit to a lesser distance from said gate segment in said non-regenerative portion than in said regenerative portion, the extent of the gate induced depletion region which forms as a result of application of said appropriate gate electrode bias to said gate electrode.

17. The semiconductor device recited in claim 16 wherein:

each of said non-regenerative segments is bounded by one of said gate electrode segments; and in said non-regenerative portion, at least a portion of said second region which spaces apart adjacent ones of said gate electrode segments is doped to a substantially lower concentration than the portion of said second region in said regenerative portion of said device.

18. The semiconductor device recited in claim 14 wherein:

said one of said second and third regions is said second region; and said means for preventing comprises dopant in substantially higher concentration in the portion of said second region which spaces apart adjacent gate electrode segments in said non-regenerative portion than in the remainder of said second region.

19. The semiconductor device recited in claim 14 wherein said means for preventing comprises a gate insulator having a larger dielectric-constant-thickness integral adjacent said non-regenerative portion of said device than adjacent said regenerative portion of said device.

20. The semiconductor device recited in claim 14 wherein said means for preventing comprises:

a spacer or barrier region disposed between said non-regenerative portion of said device and said gate electrode.

21. The semiconductor device recited in claim 20 wherein said barrier region comprises a second insulated gate electrode.

22. The semiconductor device recited in claim 14 wherein in said non-regenerative portion:

said first region is omitted; and said first power electrode forms a Schottky contact to said second region.

* * * * *